United States Patent
Hsiao et al.

(10) Patent No.: US 9,728,616 B2
(45) Date of Patent: Aug. 8, 2017

(54) HIGH-VOLTAGE METAL-OXIDE-SEMICONDUCTOR TRANSISTOR DEVICE AND MANUFACTURING METHOD THEREOF

(71) Applicant: UNITED MICROELECTRONICS CORP., Hsin-Chu (TW)

(72) Inventors: Shih-Yin Hsiao, Chiayi County (TW); Kai-Kuen Chang, Keelung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 3 days.

(21) Appl. No.: 14/922,209

(22) Filed: Oct. 26, 2015

(65) Prior Publication Data

US 2017/0077250 A1    Mar. 16, 2017

(30) Foreign Application Priority Data

Sep. 15, 2015 (CN) .......................... 2015 1 0585089

(51) Int. Cl.
*H01L 29/423* (2006.01)
*H01L 29/78* (2006.01)
*H01L 29/66* (2006.01)

(52) U.S. Cl.
CPC .... *H01L 29/4232* (2013.01); *H01L 29/66545* (2013.01); *H01L 29/66689* (2013.01); *H01L 29/7816* (2013.01)

(58) Field of Classification Search
None
See application file for complete search history.

(56) References Cited

U.S. PATENT DOCUMENTS

| | | | |
|---|---|---|---|
| 5,965,464 A | 10/1999 | Tsai | |
| 6,891,235 B1* | 5/2005 | Furukawa | H01L 21/26586 257/408 |
| 8,685,827 B2 | 4/2014 | Kim | |
| 8,735,988 B2 | 5/2014 | Lin | |
| 2009/0321823 A1* | 12/2009 | Jung | H01L 21/823418 257/335 |
| 2011/0215404 A1* | 9/2011 | Zhu | H01L 21/8234 257/336 |
| 2012/0032277 A1* | 2/2012 | Manabe | H01L 21/26586 257/408 |
| 2013/0161739 A1* | 6/2013 | Tseng | H01L 29/404 257/336 |
| 2014/0225176 A1 | 8/2014 | Cheek | |

\* cited by examiner

*Primary Examiner* — Reema Patel
(74) *Attorney, Agent, or Firm* — Winston Hsu (57) ABSTRACT

The present invention provides a high-voltage metal-oxide-semiconductor transistor device and a manufacturing method thereof. First, a semiconductor substrate is provided and a dielectric layer and a conductive layer sequentially stacked on the semiconductor substrate. Then, the conductive layer is patterned to form a gate and a dummy gate disposed at a first side of the gate and followed by forming a first spacer between the gate and the dummy gate and a second spacer at a second side of the gate opposite to the first side, wherein the first spacer includes an indentation. Subsequently, the dummy gate is removed.

24 Claims, 8 Drawing Sheets

FIG. 15

HIGH-VOLTAGE METAL-OXIDE-SEMICONDUCTOR TRANSISTOR DEVICE AND MANUFACTURING METHOD THEREOF

BACKGROUND OF THE INVENTION

1. Field of the Invention

The present invention relates to a high-voltage (HV) metal-oxide-semiconductor (MOS) transistor device and a manufacturing method thereof, and more particularly, to a HV MOS transistor device used for reducing leakage current and a manufacturing method thereof.

2. Description of the Prior Art

Double diffused drain metal-oxide-semiconductor (DDD-MOS) transistor has both planar structure and high voltage-endurance ability, which is able to have better integration with the manufacturing method of standard complementary transistor device, and thus the DDDMOS transistor has become a common high-voltage device, and has been widely applied to high-voltage operating environments, such as power supplies for CPU, power managing systems, AC/DC converters or high-bandwidth power amplifiers.

The drain of the conventional DDDMOS transistor is formed by an ion implantation process and a thermal drive-in process using the gate and the spacer as a mask, and is designed to be a heavily doped region formed in a drift region with less doping concentration as compared with the heavily doped region, so the drift region can be used to tolerate high voltage from the drain. However, with minimization of the size of the transistor, the width of the spacer formed by advanced manufacturing processes becomes thinner and thinner, and thus the drain is much closer to the gate. As a result, the leakage current (from drain to base) of the DDDMOS transistor when the transistor in the off state is dramatically increased because of the gate induced drain current (GIDL) effect.

Therefore, it is a common goal in this field to provide a high-voltage (HV) metal-oxide-semiconductor (MOS) transistor device and a manufacturing method thereof to reduce the leakage current.

SUMMARY OF THE INVENTION

An objective of the present invention is to provide a high-voltage (HV) metal-oxide-semiconductor (MOS) transistor device and a manufacturing method thereof to reduce the leakage current.

According to an exemplary embodiment, a HV MOS transistor device is provided. The HV MOS transistor device includes a semiconductor substrate, a gate structure, a first doped region, and a second doped region. The gate structure is disposed on the semiconductor substrate and includes a gate, a first spacer and a second spacer. The first spacer is disposed at a first side of the gate, wherein the first spacer includes a first indentation. The second spacer is disposed at a second side of the gate opposite to the first side. The first doped region is disposed in the semiconductor substrate and is adjacent to the first spacer, wherein the first spacer is disposed between the first doped region and the gate. The second doped region is disposed in the semiconductor substrate and is adjacent to the second spacer, wherein the second spacer is disposed between the second doped region and the gate.

According to another exemplary embodiment, a manufacturing method of a HV MOS transistor device is provided. First, a semiconductor substrate, a dielectric layer and a conductive layer are provided, wherein the dielectric layer and the conductive layer are sequentially stacked on the semiconductor substrate. Then, the conductive layer is patterned to form a gate and a first dummy gate, wherein the first dummy gate is disposed at a first side of the gate. Subsequently, a first spacer is formed on the semiconductor substrate between the gate and the first dummy gate, and a second spacer is formed on the semiconductor substrate at a second side of the gate opposite to the first side, wherein the first spacer includes a first indentation. After that, the first dummy gate is removed.

In the HV MOS transistor device of the present invention, the gap between the gate and the first dummy gate (the width of the first spacer) is designed to be smaller than or the same as twice the width of the first dummy spacer, such that the first spacer is self-alignedly formed between the gate and the first dummy gate and has a self-aligned structure. In addition, the width of the first spacer is larger than the width of the first dummy spacer, so that the first doped region and the second doped region formed by using the first spacer as the mask are prevented from being too close to the gate. As a result, the gap between the first doped region formed by using the first spacer and the first dummy spacer as the mask and the gate may be increased, thereby reducing the GIDL effect, and effectively decreasing the leakage current of the HV MOS transistor device in the off state.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
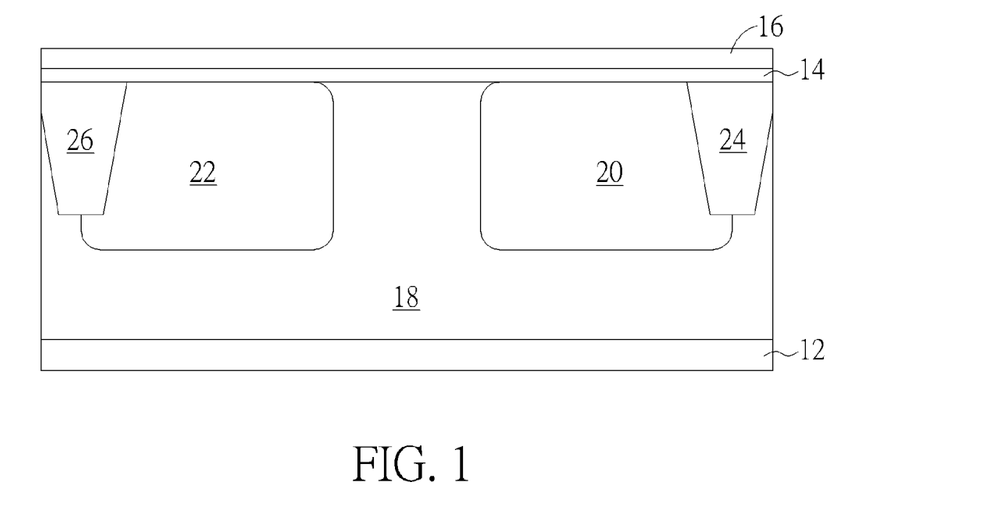
FIG. 1 to FIG. 5 are schematic diagrams illustrating a manufacturing method of a HV MOS transistor device according to a first embodiment of the present invention.
Figure 3:
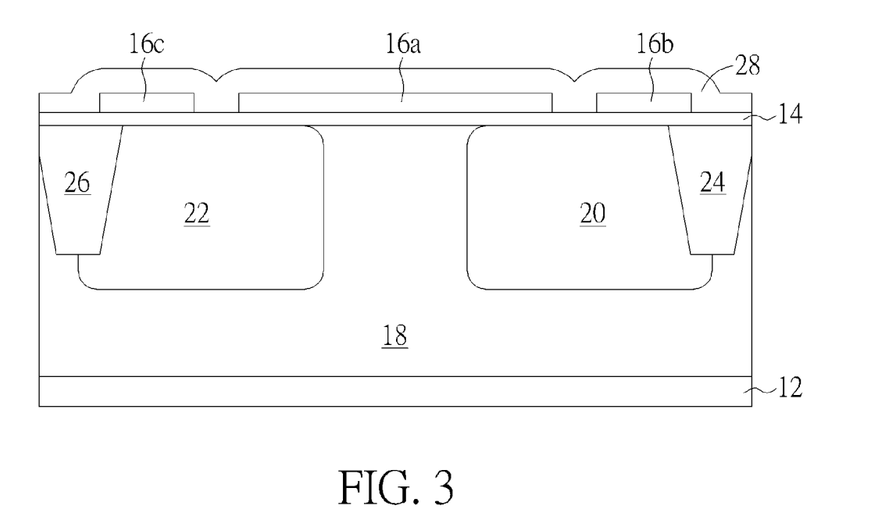
Figure 4:
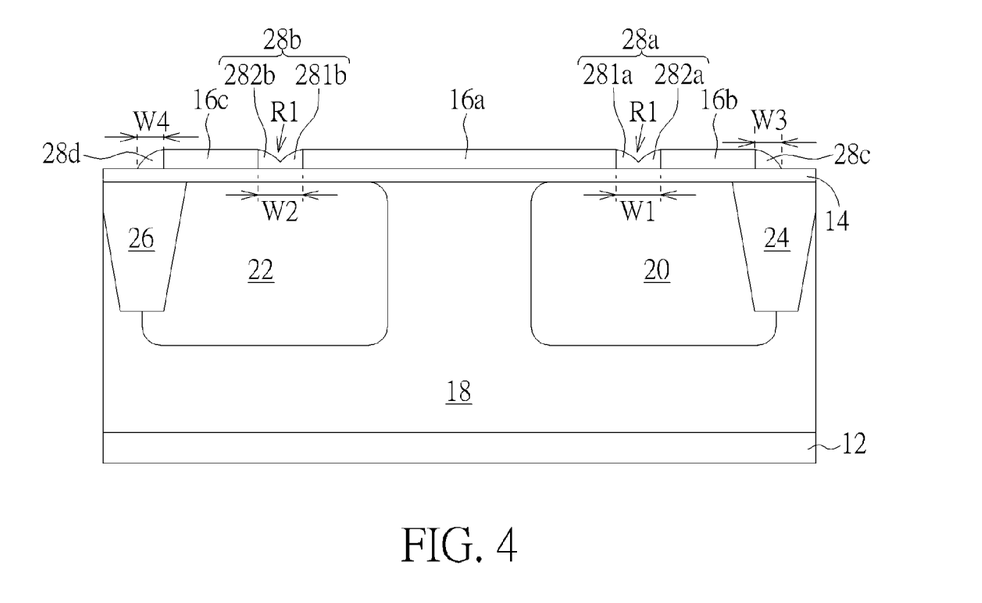
Figure 5:
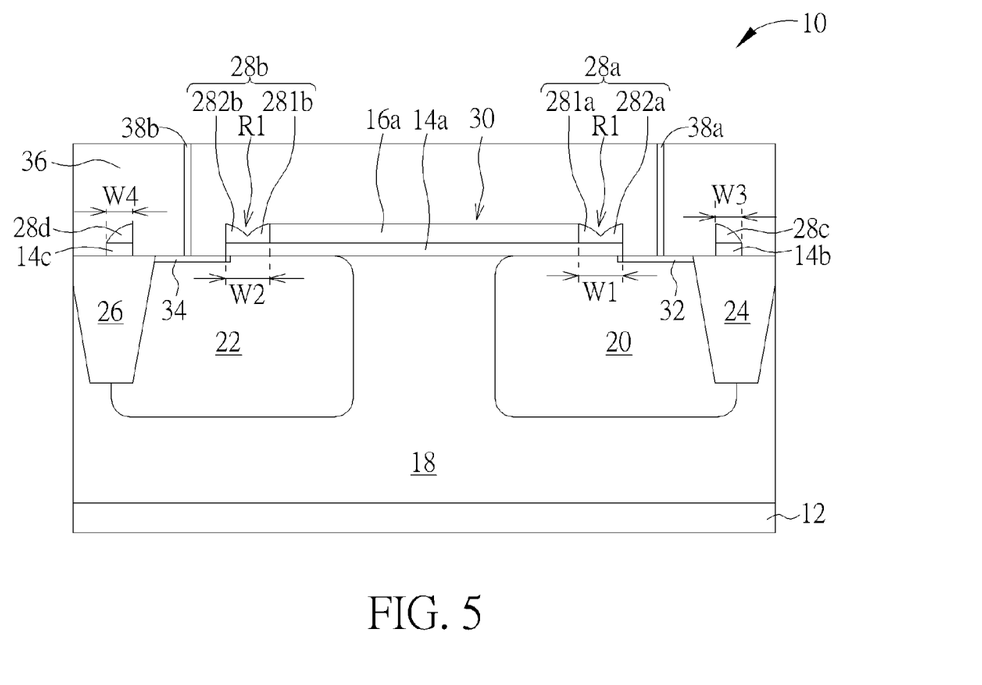

Refer to FIGS. 1-5, which are schematic diagrams illustrating a manufacturing method of a high-voltage (HV) metal-oxide-semiconductor (MOS) transistor device according to a first embodiment of the present invention, wherein FIG. 5 is a cross-sectional view diagram illustrating the HV MOS transistor device according to the first embodiment of the present invention. As shown in FIG. 1, first, a semiconductor substrate 12, a dielectric layer 14 and a conductive layer 16 are provided. In the present embodiment, the semiconductor substrate 12 may include a silicon substrate, an epitaxial silicon substrate, a silicon germanium substrate, a silicon carbide substrate or a silicon-on-insulator (SOI) substrate, but not limited thereto. For instance, the semiconductor substrate 12 may include a first conductivity type or a second conductivity type, and a well region 18 including the first conductivity type may be formed on the semiconductor substrate 12 before the dielectric layer 14 is formed, but the present invention is not limited thereto.

In another embodiment, the well region may not be formed in the semiconductor substrate, and the semiconductor substrate should include the first conductivity type. In another embodiment, the semiconductor substrate may include a fin structure (not shown in figures) of a fin field effect transistor (FinFET). The fin structure may be formed by photolithographic etching pattern (PEP) processes or multi patterning processes. Preferably, the fin structure may be formed by a spacer self-aligned double-patterning (SADP) method, in other words, a sidewall image transfer (SIT) method to pattern a bulk silicon substrate or a monocrystalline silicon layer on the surface of the SOI substrate, and forming a fin shape silicon thin film in the bulk silicon substrate or the SOI substrate, but not limited thereto.

In the present embodiment, after forming the well region 18, a first drift region 20 and a second drift region 22 including the second conductivity type may be selectively formed in the well region 18 and used for voltage endurance. In the present embodiment, the first drift region 20 and the second drift region 22 may be gradient doped regions with gradient concentration respectively, but the present invention is not limited thereto, the first drift region 20 and the second drift region 22 may be only lightly dope regions. After that, a first insulation structure 24 and a second insulation structure 26 may be selectively formed in the semiconductor substrate 12 respectively at an outer side of the first drift region 20 and an outer side of the second drift region 22, so that the first drift region 20 and the second drift region 22 are located between the first insulation structure 24 and the second insulation structure 26, and the first insulation structure 24 and the second insulation structure 26 may be used for electrically insulating the HV MOS transistor device 10 from other devices in the semiconductor substrate 12. In the present embodiment, the first insulation structure 24 may contact the first drift region 20, and the second insulation structure 26 may contact the second drift region 22. In addition, the first insulation structure 24 and the second insulation structure 26 may be shallow trench isolation (STI) structures respectively, but not limited thereto, the first insulation structure 24 and the second insulation structure 26 may be other types of structures as well. Subsequently, the dielectric layer 14 and the conductive layer 16 are sequentially formed and stacked on the first insulation structure 24, the second insulation structure 26 and the semiconductor substrate 12 via deposition processes.

Figure 2:
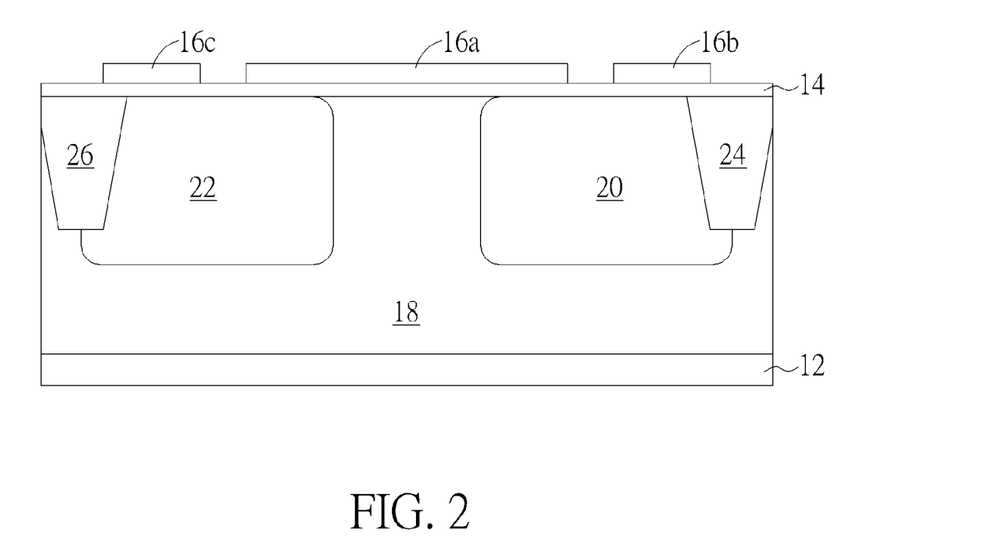

As shown in FIG. 2, the conductive layer 16 may be patterned through a PEP process to form a gate 16a, a first dummy gate 16b and a second dummy gate 16c separated from one another. In the present embodiment, the gate 16a is located directly on the well region 18 between the first drift region 20 and the second drift region 22, and the gate 16a may overlap a portion of the first drift region 20 and a portion of the second drift region 22 in a direction perpendicular to an upper surface of the semiconductor substrate 12. In other words, the first drift region 20 is disposed in the well region 18 at a first side of the gate 16a, and the second drift region 22 is disposed in the well region 18 at a second side of the gate 16a opposite to the first side. Further, the first dummy gate 16b is disposed on the first drift region 20 at the first side of the gate 16a, and preferably overlaps the first insulation structure 24 adjacent to the first drift region 20. The second dummy gate 16c is disposed on the second drift region 22 at the second side of the gate 16a, and preferably overlaps the second insulation structure 26 adjacent to the second drift region 22.

As shown in FIG. 3, a spacer material layer 28 is blanket deposited on the dielectric layer 14, the gate 16a, the first dummy gate 16b and the second dummy gate 16c. The spacer material layer 28 fills the gap between the gate 16a and the first dummy gate 16b, and the gap between the gate 16a and the second dummy gate 16c. In the present embodiment, the spacer material layer 28 is a single oxide layer, but the present invention is not limited thereto. In another embodiment, the spacer material layer may include a multilayer structure, for example, a stack of an oxide layer and a nitride layer, or a stack of an oxide layer, a nitride layer and another oxide layer, but not limited thereto.

As shown in FIG. 4, a blanket etching back process is performed to remove the spacer material layer 28 on the gate 16a, the first dummy gate 16b and the second dummy gate 16c and to self-alignedly form a first spacer 28a, a second spacer 28b, a first dummy spacer 28c and a second dummy spacer 28d. In the present embodiment, since the spacer material layer 28 is a single oxide layer, each of the first spacer 28a, the second spacer 28b, the first dummy spacer 28c and the second dummy spacer 28d may consist of an oxide spacer respectively, but not limited thereto. Further, the etching back process only etches the spacer material layer 28 once, and may be an anisotropic etching process, so that the spacer material layer 28 adjacent to a sidewall of the gate 16a, a sidewall of the first dummy gate 16b and a sidewall of the second dummy gate 16c may be left. Accordingly, the first spacer 28a is formed on the first drift region 20 between the gate 16a and the first dummy gate 16b; the second spacer 28b is formed on the second drift region 22 between the gate 16a and the second dummy gate 16c; the first dummy spacer 28c is formed on the semiconductor substrate 12 at a side of the first dummy gate 16b adjacent to the first insulation structure 24; and the second dummy spacer 28d is formed on the semiconductor substrate 12 at a side of the second dummy gate 16c adjacent to the second insulation structure 26. In the present embodiment, the first dummy spacer 28c and the second dummy spacer 28d are respectively formed directly on the first insulation structure 24 and the second insulation structure 26, but not limited thereto.

Specifically, since the gap between the gate 16a and the first dummy gate 16b and the gap between the gate 16a and the second dummy gate 16c is small enough, under the situation of performing the blanket etching back process without using any masks, the spacer material layer 28 in the gap between the gate 16a and the first dummy gate 16b and in the gap between the gate 16a and the second dummy gate 16c may not be separated into two independent spacers, but a single first spacer 28a is formed between the gate 16a and the first dummy gate 16b, and a single second spacer 28b is formed between the gate 16a and the second dummy gate 16c. Further, since the etching rate of the spacer material layer 28 away from the sidewalls of the gate 16a, the first dummy gate 16b and the second dummy gate 16c is faster than that of the spacer material layer 28 close to the sidewalls of the gate 16a, the first dummy gate 16b and the second dummy gate 16c, so that an upper surface of the first spacer 28a and an upper surface of the second spacer 28b may respectively include a first indentation R1, but not limited thereto. Whether the first spacer 28a and the second spacer 28b are formed as a single structure or two separate structures are depend on the thickness of the conductive layer, the gap between the gate 16a and the first dummy gate 16b, and the gap between the gate 16a and the second dummy gate 16c. For example, in advanced manufacturing processes, in order to avoid the gate 16a being inseparable from the first dummy gate 16b and the second dummy gate 16c, the thickness of the conductive layer 16 needs to be low enough to separate the gate 16a from the first dummy gate 16b and the second dummy gate 16c. Therefore, the gap between the gate 16a and the first dummy gate 16b, and the gap between the gate 16a and the second dummy gate 16c may be respectively between 0.01 micrometer and 0.4 micrometer.

Further, the first spacer 28a formed between the gate 16a and the first dummy gate 16b includes two spacer portions 281a and 282a which are connected together and respectively formed on a sidewall of the gate 16a and a sidewall of the first dummy gate 16b, so that the spacer portions 281a and 282a contact the sidewall of the gate 16a and the sidewall of the first dummy gate 16b respectively. The spacer portions 281a and 282a respectively includes a convex upper surface, and the convex upper surfaces face and contact each other to form the first indentation R1. In addition, the convex upper surface is a tilted surface. Take the spacer portion 281a close to the gate 16a as an example, when the distance between the upper surface of the spacer portion 281a and the gate 16a is larger, the distance between the upper surface of the spacer portion 281a and the upper surface of the semiconductor substrate 12 is smaller. Similarly, for the spacer portion 282a close to the first dummy gate 16b, when the distance between the upper surface of the spacer portion 282a and the first dummy gate 16b is larger, the distance between the upper surface of the spacer portion 282a and the upper surface of the semiconductor substrate 12 may be smaller. Thus, the first indentation R1 has a funnel-like shape. Preferably, the first spacer 28a consists of two spacer portions 281a, 282a, and the spacer portions 281a, 282a are symmetrical to each other with respect to a direction perpendicular to the upper surface of the semiconductor substrate 12, so that the first indentation R1 has a self-symmetrical structure. Likewise, the second spacer 28b and the first spacer 28a are symmetrical with respect to gate 16a, and therefore the second spacer 28b also preferably consists of the spacer portions 281b, 282b, and has a self-symmetrical structure. To connect the spacer portions 281a and 282a and connect the spacer portions 281b and 282b, the gap between the gate 16a and the first dummy gate 16b (the width W1 of the first spacer 28a) and the gap between the gate 16a and the second dummy gate 16c (the width W2 of the second spacer 28b) may be smaller than or the same as twice the width W3 of the first dummy spacer 28c or twice the width W4 of the second dummy spacer 28d. Therefore, the width of the first spacer 28a and the width of the second spacer 28b preferably may be respectively between 0.01 micrometer and 0.4 micrometer.

As shown in FIG. 5, after the etching back process, the first dummy gate 16b and the second dummy gate 16c are removed through a photolithography and etching process to expose the dielectric layer 14 between the first spacer 28a and the first dummy spacer 28c and the dielectric layer 14 between the second spacer 28b and the second dummy spacer 28d. Subsequently, the exposed dielectric layer 14 is removed to form a gate dielectric layer between the gate 16a and the semiconductor substrate 12 and to expose the first drift region 20 between the first spacer 28a and the first dummy spacer 28c and the second drift region 22 between the second spacer 28b and the second dummy spacer 28d. At this point, the gate structure 30 including the gate 16a, the gate dielectric layer 14a, the first spacer 28a and the second spacer 28b is formed. In the present embodiment, since some portions of the dielectric layer 14 are removed after the formation of the first spacer 28a, the second spacer 28b, the first dummy spacer 28c and the second dummy spacer 28d, accordingly, the gate dielectric layer 14a extends to be disposed directly under the first spacer 28a and the second spacer 28b; a first dielectric block 14b is formed between the first dummy spacer 28c and the semiconductor substrate 12; and a second dielectric block 14c is formed between the second dummy spacer 28d and the semiconductor substrate 12. Preferably, the first dielectric block 14b contacts the first insulation structure 24, and the second dielectric block 14c contacts the second insulation structure 26.

In another embodiment, the gate dielectric layer may be formed between depositing the spacer material layer and patterning the conductive layer, that is to say, after the conductive layer is patterned, the gate, the first dummy gate and the second dummy gate are used as the mask to pattern the dielectric layer so as to form the gate dielectric layer between the gate and the semiconductor substrate and form two dummy dielectric blocks between the first dummy gate and the semiconductor substrate and between the second dummy gate and the semiconductor substrate respectively. In this case, the width of the gate equals the width of the gate dielectric layer. Then, after the first dummy gate and the second dummy gate are removed, the dummy dielectric block may be immediately removed. Thus, the first dummy spacer and the second dummy spacer directly contact the first insulation structure and the second insulation structure respectively.

Please refer to FIG. 5 again. After the exposed dielectric layer 14 is removed, the gate 16a, the first spacer 28a, the second spacer 28b, the first dummy spacer 28c and the second dummy spacer 28d are used as a mask to carry out an ion implantation process and a thermal drive-in process to form a first doped region 32 including the second conductivity type in the first drift region 20 at the first side of the gate 16a and form a second doped region 34 including the second conductivity type in the second drift region 22 at the second side of the gate 16a together. At this point, the HV MOS transistor device 10 of the present embodiment is formed, wherein the first doped region 32 and the second doped region 34 may be the drain region and the source region of the HV MOS transistor device 10 respectively. In the present embodiment, the first doped region 32 is located between the first spacer 28a and the first insulation structure 24, and the first spacer 28a is disposed between the first doped region 32 and the gate 16a. The second doped region 34 is located between the second spacer 28b and the second insulation structure 26, and the second spacer 28b is disposed between the second doped region 34 and the gate 16a. Specifically, since the first dummy spacer 28c is disposed directly on the first insulation structure 24, and the gap between the first spacer 28a and the first dummy spacer 28c not only exposes a part of the first drift region 20 but also exposes the first insulation structure 24, the first doped region 32 contacts the first insulation structure 24. Likewise, the second doped region 34 contacts the second insulation structure 26. In addition, the concentration of the first doped region 32 and the concentration of the second doped region 34 are higher than the concentration of the first drift region 20 and the concentration of the second drift region 22.

After the first and second doped regions 32 and 34 are formed, an inter-layer dielectric (ILD) layer 36 may be blanket formed, and a plurality of contact plugs 38a, 38b may be formed in the ILD layer 36. Then, a gate metal layer, a drain metal layer and a source metal layer may be formed on the ILD layer 36, which are electrically connected to the gate 16a, the first doped region 32 and the second doped region 34 respectively. For example, the ILD layer 36 contacts the sidewalls and the upper surface of the first dummy spacer 28c, so the ILD layer 36 covers the first dummy spacer 28c and the first dielectric block 14b on the first insulation structure 24. Furthermore, the ILD layer 36 also contacts the sidewalls and the upper surface of the second dummy spacer 28d, so the ILD layer 36 covers the second dummy spacer 28d and the second dielectric block 14c on the second insulating structure 26. In addition, the contact plug 38a passes through the gap between the first spacer 28a and the first dummy spacer 28c to contact the first doped region 32, so that the first doped region 32 may be electrically connected to the drain metal layer via the contact plug 38a. The contact plug 38a may include a metal silicide contacting the first doped region 32. In another embodiment, the metal silicide may also be formed on the surface of the first doped region and contacts the contact plug. Similarly, the contact plug 38b passes through the gap between the second spacer 28b and the second dummy spacer 28d to contact the second doped region 34, so that the second doped region 34 may be electrically connected to the source metal layer via the contact plug 38b, but not limited thereto. As a result, the HV MOS transistor device 10 may be electrically connected to a corresponding device or circuit.

It is worth mentioning that, in the HV MOS transistor device 10 of the present embodiment, the gap between the gate 16a and the first dummy gate 16b (the width W1 of the first spacer 28a) and the gap between the gate 16a and the second dummy gate 16c (the width W2 of the second spacer 28b) are designed to be smaller than or the same as twice width W3 of the first dummy spacer 28c or twice the width W4 of the second dummy spacer 28d, such that the first spacer 28a and the second spacer 28b are self-alignedly formed between the gate 16a and the first dummy gate 16b and between the gate 16a and the second dummy gate 16c, and have self-aligned structures, respectively. In addition, the width W1 of the first spacer 28a or the width W2 of the second spacer 28b may be larger than the width W3 of the first dummy spacer 28c or the width W4 of the second dummy spacer 28d, so that the first doped region 32 and the second doped region 34 formed by using the first spacer 28a and the second spacer 28b as the mask are prevented from being too close to the gate 16a. As a result, the gap between the first doped region 32 formed by using the first spacer 28a and the first dummy spacer 28c as the mask and the gate 16a and the gap between the second doped region 34 formed by using the second spacer 28b and the second dummy spacer 28d as the mask and the gate 16a may be increased, thereby reducing the GIDL effect and effectively decreasing the leakage current of the HV MOS transistor device 10 in the off state. In addition, as compared to the conventional gate manufacturing method, only an additional photolithography and etching process is introduced to remove the first dummy gate 16b and the second dummy gate 16c in the present embodiment, so that the cost of the present embodiment will not increase too much.

In the present embodiment, the first conductivity type may be N-type, the second conductivity type may be P-type, and the HV MOS transistor device 10 is a PMOS, but those skilled in the art should be aware that the first conductivity type and the second conductivity type can be exchanged and the HV MOS transistor device may be a NMOS, but not limited to those cases described in this embodiment.

In another embodiment, the first and second dummy spacer may be selectively removed by using another photolithography and etching process prior to the formation of ILD layer. Since the bonding strength between the first dummy spacer and the semiconductor substrate and between second dummy spacer and the semiconductor substrate may be reduced in the subsequent manufacturing processes and the break between the first dummy spacer and the semiconductor substrate and between second dummy spacer and the semiconductor substrate may be generated to cause particle pollution in the transistor device, the additional step can avoid such problem of particle pollution.

The HV MOS transistor device and the manufacturing method thereof are not limited to the aforementioned embodiment, and may have other different preferred embodiments. To simplify the description, the identical components in each of the following embodiments are marked with identical symbols. For making it easier to compare the differences between the embodiments, the following description will detail the dissimilarities among different embodiments and the identical features will not be redundantly described.

Figure 6:
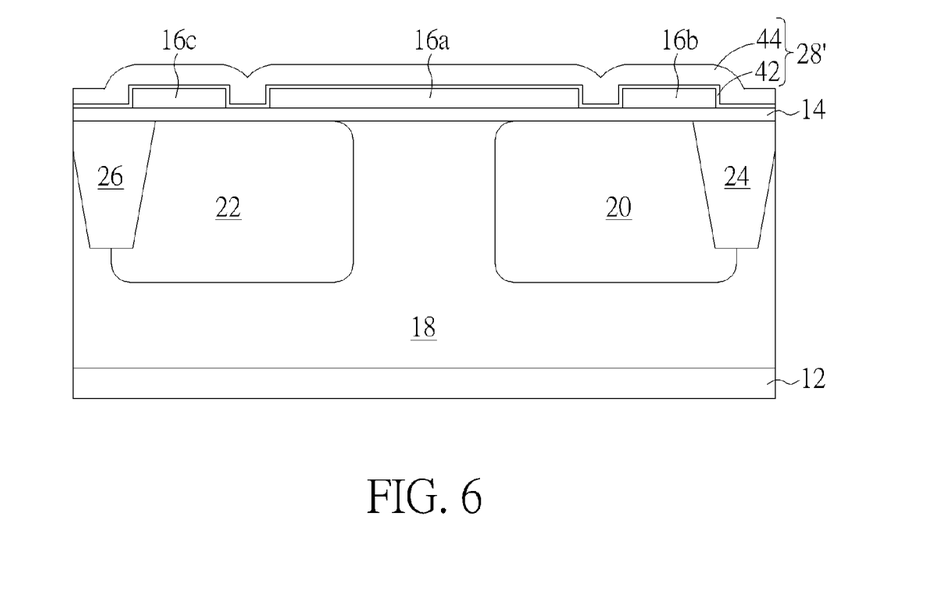
FIG. 6 and FIG. 7 are schematic diagrams illustrating a manufacturing method of a HV MOS transistor device according to a second embodiment of the present invention.
Figure 7:
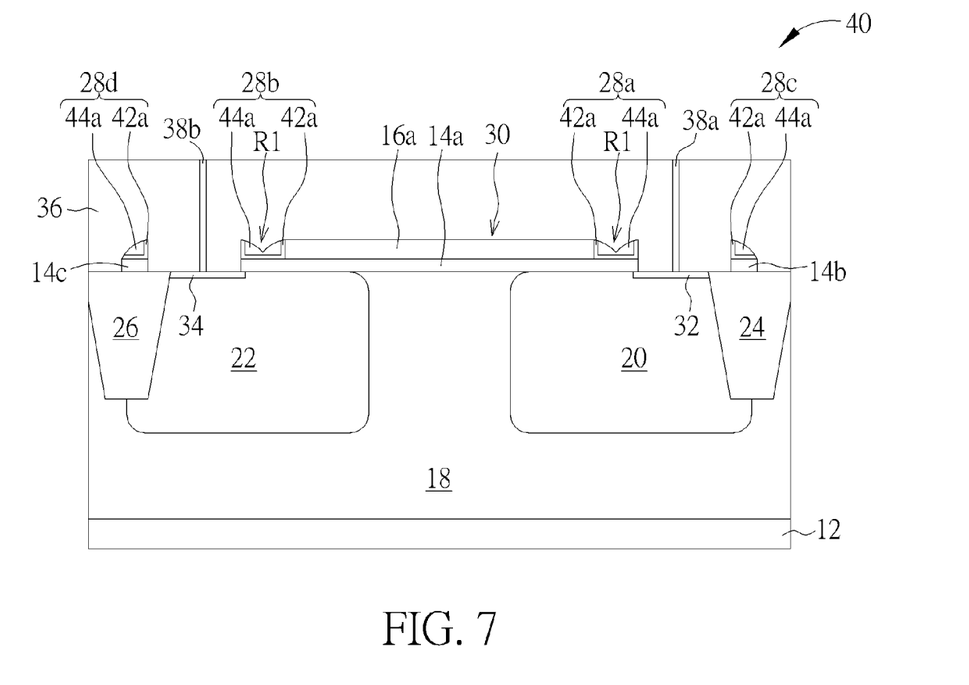

Refer to FIGS. 6-7, which are schematic diagrams illustrating a manufacturing method of a HV MOS transistor device according to a second embodiment of the present invention, wherein FIG. 6 is a cross-sectional view diagram illustrating the HV MOS transistor device according to the second embodiment of the present invention. As shown in FIG. 6, different from the first embodiment, the step of forming the spacer material layer 28' in the present embodiment includes sequentially depositing an oxide layer 42 and a nitride layer 44. As shown in FIG. 7, two successive etching back processes are performed to sequentially remove the oxide layer 42 and the nitride layer 44 on the gate 16a, the first dummy gate 16b and the second dummy gate 16c to form a stack of an oxide spacer 42a and a nitride spacer 44a, wherein the nitride spacer 44a is disposed on the oxide spacer 42a. Therefore, in the HV MOS transistor device 40 of the present embodiment, the first spacer 28a, the second spacer 28b, the first dummy spacer 28c, and the second dummy spacer 28d respectively may include the oxide spacer 42a and the nitride spacer 44a. Specifically, since the oxide layer 42 and nitride layer 44 are continuously formed followed by continuously etched, the oxide spacer 42a of the first spacer 28a and the second spacer 28b may have a U-shaped structure, and the nitride spacer 44a is formed in the recess of the U-shaped structure. In another embodiment, the step of forming the spacers may include performing a depositing process and an etching process to form the oxide spacer, followed by another depositing process and another etching process to form the nitride spacer.

Figure 8:
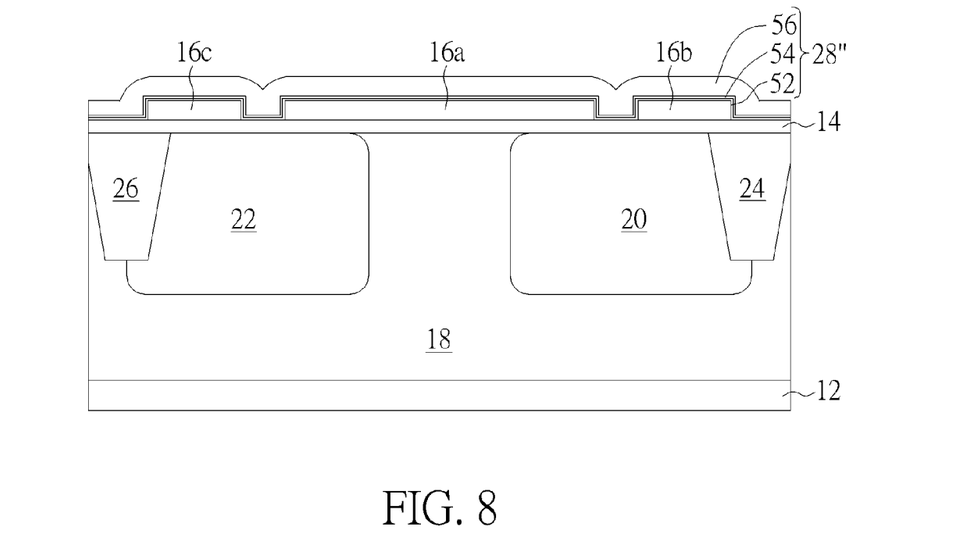
FIG. 8 and FIG. 9 are schematic diagrams illustrating a manufacturing method of a HV MOS transistor device according to a third embodiment of the present invention.
Figure 9:
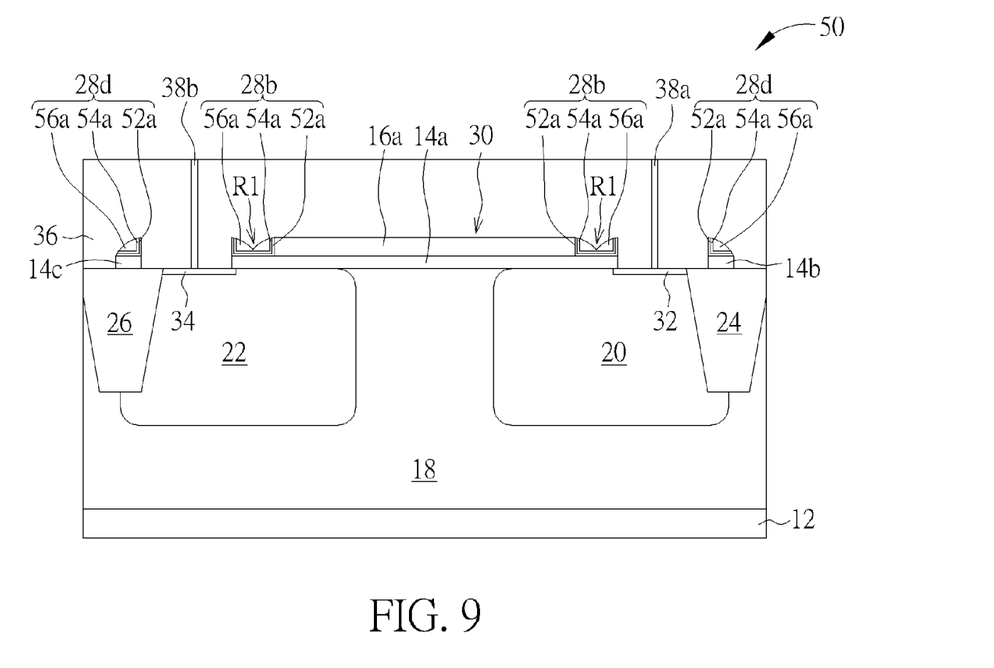

Refer to FIGS. 8-9, which are schematic diagrams illustrating a manufacturing method of a HV MOS transistor device according to a third embodiment of the present invention, wherein FIG. 9 is a cross-sectional view diagram illustrating a HV MOS transistor device according to the third embodiment of the present invention. As shown in FIG. 8, different from the first embodiment, the step of forming the spacer material layer 28" in the present embodiment includes sequentially depositing a first oxide layer 52, a nitride layer 54 and a second oxide layer 56. As shown in FIG. 9, three successive etching back processes are performed to sequentially remove the first oxide layer 52, the nitride layer 54 and second oxide layer 56 on the gate 16a, the first dummy gate 16b and the second dummy gate 16c to form a stack of a first oxide spacer 52a, a nitride spacer 54a and a second oxide spacer 56a, wherein the nitride spacer 54a is disposed on the first oxide spacer 42a, and the second oxide spacer 56a is disposed on the nitride spacer 54a. Therefore, in the HV MOS transistor device 50 of the present embodiment, the first spacer 28a, the second spacer 28b, the first dummy spacer 28c, and the second dummy spacer 28d respectively may include the first oxide spacer 52a, the nitride spacer 54a and the second oxide spacer 56a. Specifically, since the first oxide layer 52, the nitride layer 54 and second oxide layer 56 are continuously formed followed by continuously etched, the first oxide spacer 52a and the nitride spacer 54a of the first spacer 28a and the first oxide spacer 52a and the nitride spacer 54a of the second spacer 28b may have a U-shaped structure respectively, and each second oxide spacer 56a is formed in the recess of each U-shaped structure. In another embodiment, the step of forming the spacer may include continuously performing a depositing process and an etching back process once to form a first U-shaped oxide spacer. Then, the nitride layer and the second oxide layer are formed successively and followed by performing etching back processes to form the nitride spacers and the second oxide spacers. Alternatively, the step of forming the spacer may include performing two depositing processes to form a first oxide layer and a nitride layer. Then, an etching back process is performed to form a first oxide spacer with a U-shaped structure and a nitride spacer formed in the recess of the U-shaped structure. After that, a depositing process and an etching back process are performed sequentially to forma second oxide spacer in the recess of the U-shaped structure.

Figure 10:
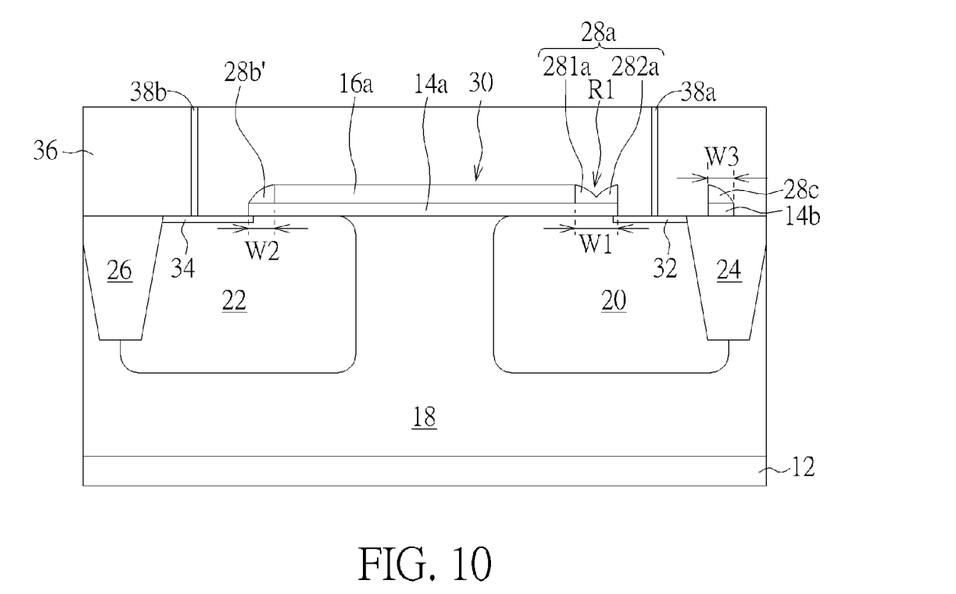
FIG. 10 is a cross-sectional view diagram illustrating a HV MOS transistor device according to a fourth embodiment of the present invention.

Refer to FIG. 10, which is a cross-sectional view diagram illustrating a HV MOS transistor device according to a fourth embodiment of the present invention. As shown in FIG. 10, different from the first embodiment, the step of patterning the conductive layer 16 in the present embodiment only forms the gate 16a and the first dummy gate 16b, but doesn't form the second dummy gate. Accordingly, after the etching back process, the width W2' of the second spacer 28b' is substantially the same as the width W3 of the first dummy spacer 28c, and less than the width W1 of the first spacer 28a, and no second dummy spacer is formed.

Figure 11:
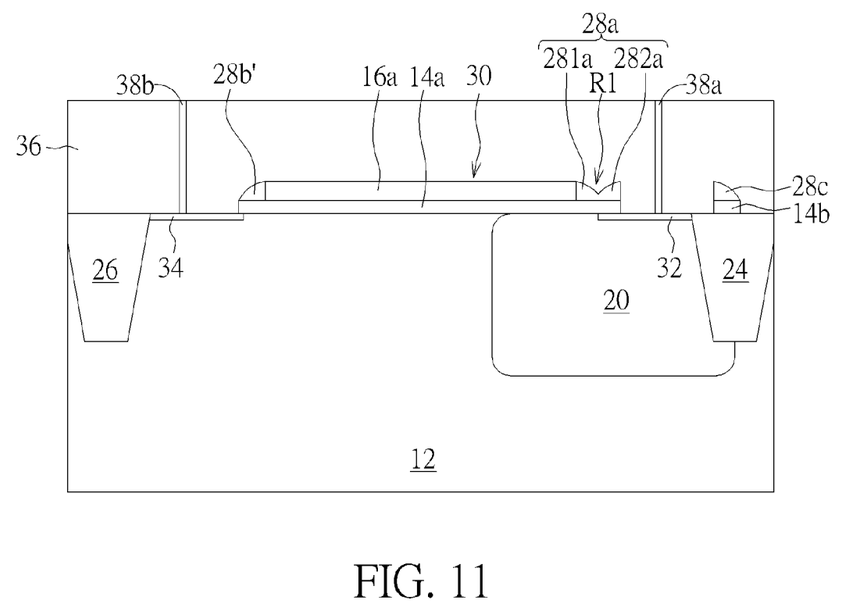
FIG. 11 is a cross-sectional view diagram illustrating a HV MOS transistor device according to a fifth embodiment of the present invention.

Please refer to FIG. 11, which is a cross-sectional view diagram illustrating a HV MOS transistor device according to a fifth embodiment of the present invention. As shown in FIG. 11, different form the fourth embodiment, the manufacturing method according to the present embodiment only forms the first drift region 20, but doesn't form the second drift region. Thus, the P-type second doped region 34 is directly formed in the well region 18. In another embodiment, the semiconductor substrate may not have a well region formed therein, and the semiconductor substrate has a first conductivity type. Accordingly, the first doped region can be directly formed in the semiconductor substrate including the first conductivity type.

Figure 12:
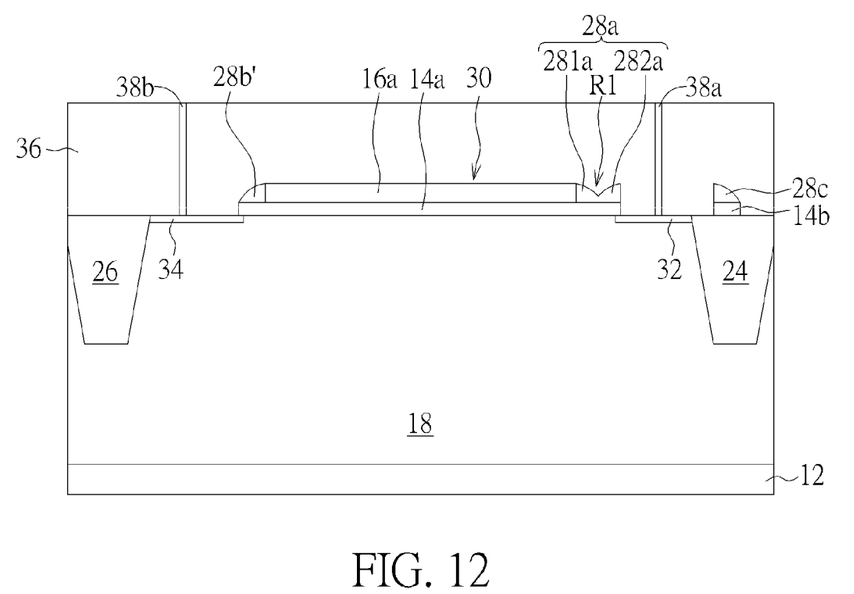
FIG. 12 is a cross-sectional view diagram illustrating a HV MOS transistor device according to a sixth embodiment of the present invention.

Refer to FIG. 12, which is a cross-sectional view diagram illustrating a HV MOS transistor device according to a sixth embodiment of the present invention. As shown in FIG. 12, different form the fifth embodiment, the manufacturing method according to the present embodiment omits the step of forming the well region and first the drift region. Therefore, the first doped region 32 and the second doped region 34 are formed directly in the semiconductor substrate 12 including the first conductivity type. In another embodiment, the semiconductor substrate may have the well region, so that the first doped region and the second doped region may be directly formed in the well region.

Figure 13:
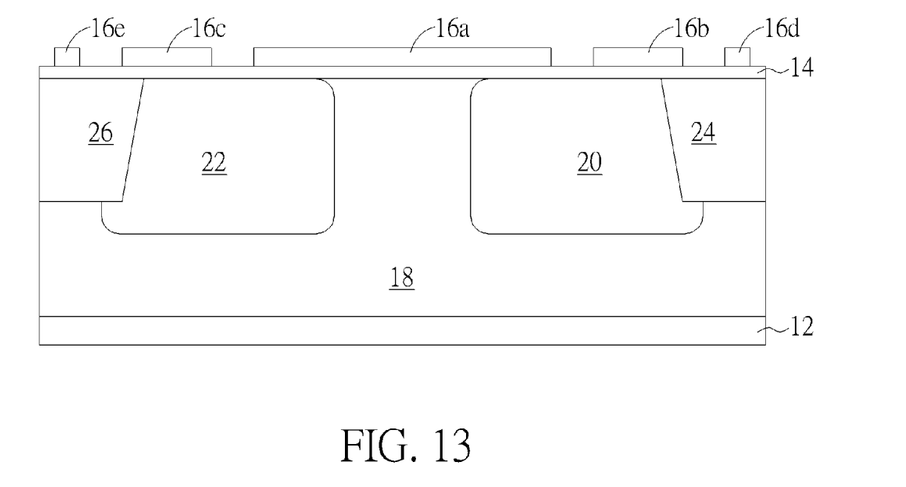
FIG. 13 and FIG. 14 are schematic diagrams illustrating a manufacturing method of a HV MOS transistor device according to a seventh embodiment of the present invention.
Figure 14:
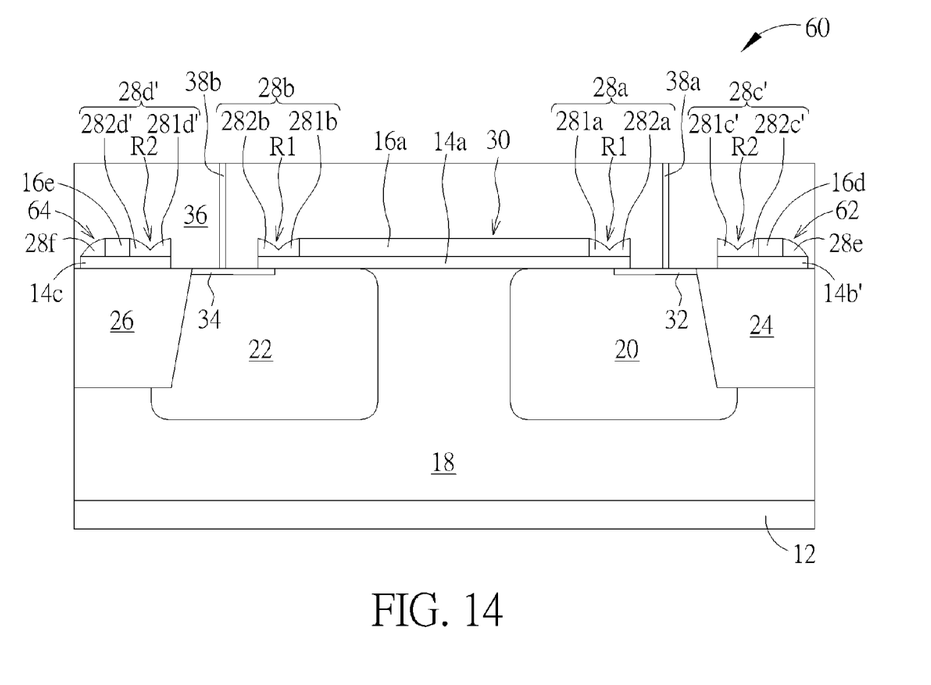

Refer to FIGS. 13-14, which are schematic diagrams illustrating a manufacturing method of a HV MOS transistor device according to a seventh embodiment of the present invention, wherein FIG. 14 is a cross-sectional view diagram illustrating a HV MOS transistor device according to the seventh embodiment of the present invention. As shown in FIG. 13, different from the first embodiment, the step of patterning the conductive layer 16 in the present embodiment further includes forming a third dummy gate 16d and a fourth dummy gate 16e on the semiconductor substrate 12. Preferably, the third dummy gate 16d and the fourth dummy gate 16e are formed directly on the first insulation structure 24 and the second insulation structure 26 respectively. The gate 16a, the first dummy gate 16b, the second dummy gate 16c, the third dummy gate 16d and the fourth dummy gate 16e are separated from each other, wherein the first dummy gate 16b is disposed between the gate 16a and the third dummy gate 16d, and the second dummy gate 16c is disposed between the fourth dummy 16e and the gate 16a. As shown in FIG. 14, the first dummy spacer 28c' and the second dummy spacers 28d' formed by the etching back process are respectively disposed between the first dummy gate 16b and the third dummy gate 16d, and between the second dummy gate 16c and the fourth dummy gate 16e, and each of which may include a second indentation R2. Specifically, the first dummy spacer 28c' may include two spacer portions 281c' and 282c', and the second dummy spacer 28d' may include two spacer portions 281d' and 282d'. Preferably, when the gap between the third dummy gate 16d and the first dummy gate 16b equals the gap between the gate 16a and the first dummy gate 16b, the first dummy spacer 28c' and the first spacer 28a may have the same structure and same width. Similarly, when the gap between the fourth dummy gate 16e and the second dummy gate electrode 16c equals the gap between the gate 16a and the second dummy gate 16c, the second dummy spacer 28d' and the second spacer 28b may have the same structure and same width. In addition, the etching back process of the present embodiment further forms a third dummy spacer 28e and a fourth dummy spacer 28f. The third dummy spacer 28e is disposed at an outer side of the third dummy gate 16d, and contacts the third dummy gate 16d, namely, the third dummy spacer 28e and the first dummy spacer 28c' are respectively located at two sides of the third dummy gate 16d. Further, since the structure of the third dummy spacer 28e and the structure of the first dummy spacer 28c' are not the same, the third dummy spacer 28e and the first dummy spacer 28c' are not symmetrical with respect to the third dummy gate 16d.

Similarly, the fourth dummy spacer 28f is disposed at an outer side of the fourth dummy gate 16e, and contacts the fourth dummy gate 16e, namely, the fourth dummy spacer 28f and the second dummy spacers 28d' are respectively located at two sides of the fourth dummy gate 16e. Next, only the first dummy gate 16b and the second dummy gate 16c are removed, and the third dummy gate 16d and the fourth dummy gate 16e remain. Then, since the first dummy spacer 28c', the third dummy spacer 28e, the third dummy gate 16d, the second dummy spacer 28d', the fourth dummy spacer 28f and the fourth dummy gate 16e are not removed, the width of the first dielectric block 14b' and the width of the second dielectric block 14c' formed by the step of removing the exposed dielectric layer 14 may be wider. The first dielectric block 14b' extends from the bottom of the first dummy spacer 28*c*' to the bottom of the third dummy spacer 28*e*, and the second dielectric block 14*c*' extends from the bottom of the second dummy spacer 28*d*' to the bottom of the fourth dummy spacer 28*f*. Accordingly, a first dummy gate structure 62 and a second dummy gate structure 64 are formed. The first dummy gate structure 62 includes the first dummy spacer 28*c*', the third dummy spacer 28*e*, the third dummy gate 16*d* and the first dielectric block 14*b*', and the first dummy gate structure 62 contacts the first insulation structure 24. The second dummy gate structure 64 includes the second dummy spacers 28*d*', the fourth dummy spacers 28*f*, the fourth dummy gate 16*e* and the second dielectric block 14*c*', and the second dummy gate structure 64 contacts the second insulation structure 26. Thus, the HV MOS transistor device 60 of the present embodiment is formed. Since subsequent steps in the present embodiment are the same as the manufacturing method of the first embodiment, the subsequent steps will not be redundantly described. In another embodiment, the spacer material layer may also include a multilayer structure, such as a stack of the oxide layer and the nitride layer, or a stack of the oxide layer, the nitride layer and oxide layer, but not limited thereto.

It is worth mentioning that, in the present embodiment, the first dummy spacer 28*c*' and the third dummy spacer 28*e* are connected to the third dummy gate 16*d*, so that the bonding strengths of the first dummy spacer 28*c*', the third dummy spacer 28*e* and the third dummy gate 16*d* bonded onto the semiconductor substrate 12 or the first insulation structure 24 via the first dielectric block 14*b*' may be enhanced. Similarly, the bonding strengths of the second dummy spacers 28*d*', the fourth dummy spacer 28*f* and the fourth dummy gate 16*e* bonded onto the semiconductor substrate 12 or the second insulation structure 26 via the second dielectric block 14*c*' may also be enhanced. As such, in the subsequent processes, the first dummy spacer 28*c*', the third dummy spacer 28*e*, the third dummy gate 16*d*, the second dummy spacer 28*d*', the fourth dummy spacers 28*f* and the fourth dummy gate 16*e* are not easily to be detached or broken from the semiconductor substrate 12, thereby avoiding the problem of particle contamination to the transistor device.

Figure 15:
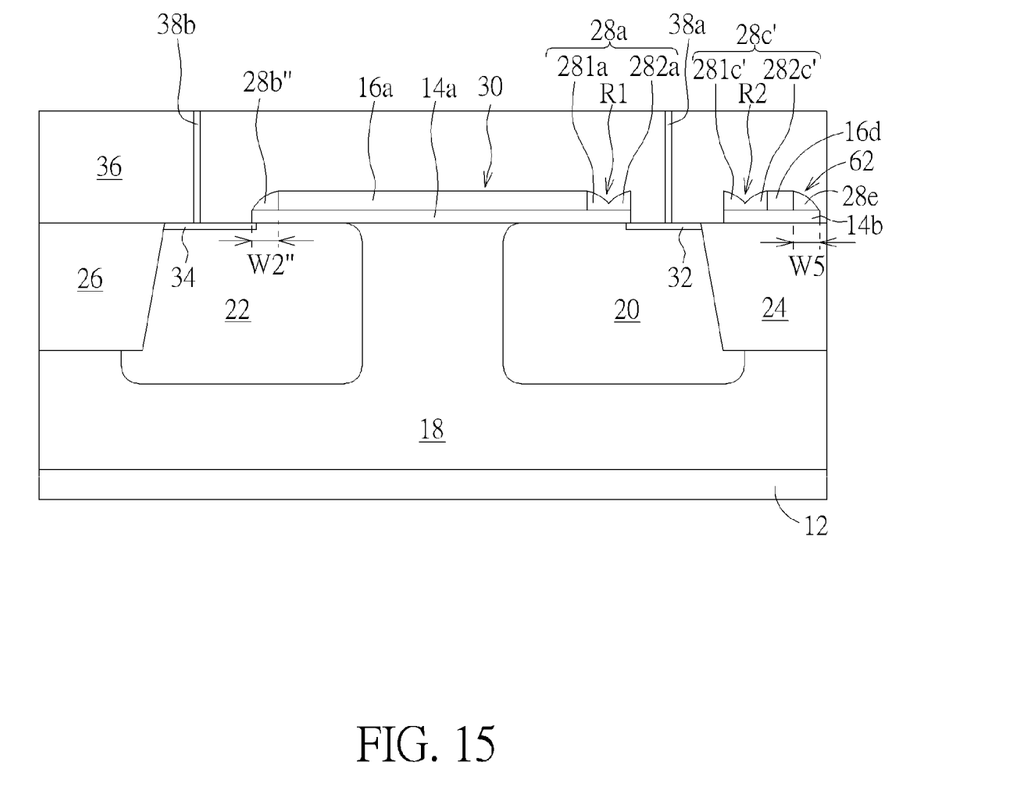
FIG. 15 is a cross-sectional view diagram illustrating a HV MOS transistor device according to an eighth embodiment of the present invention.

Refer to FIG. 15, which is a cross-sectional view diagram illustrating a HV MOS transistor device according to an eighth embodiment of the present invention. As shown in FIG. 15, different from the seventh embodiment, the second dummy gate and the fourth dummy gate are not formed in the step of patterning the conductive layer 16 in the present embodiment. Thus, during the etching back process, the width W2" of the second spacer 28*b*" is substantially the same as the width W5 of the third dummy spacer 28*e*, and is less than the width of the first spacer 28*a*, and no second dummy spacer and no fourth dummy spacer are formed. Further, in the manufacturing method of this embodiment, only the first drift region is formed without forming the second drift region. Thus, the first doped region is formed directly in the well region. In another embodiment, the semiconductor substrate may not have a well region, and the semiconductor substrate has a first conductivity type. Accordingly, the first doped region can be directly formed in the semiconductor substrate including the first conductivity type. In another embodiment, the second drift region may also be formed or omit the step of forming a first drift region.

In summary, in the HV MOS transistor device of the present invention, the gap between the gate and the first dummy gate (the width of the first spacer) and the gap between the gate and the second dummy gate (the width of the second spacer) are designed to be smaller than or the same as twice width of the first dummy spacer or twice the width of the second dummy spacer, such that the first spacer and the second spacer are self-alignedly formed between the gate and the first dummy gate and between the gate and the second dummy gate, and have self-aligned structures, respectively. In addition, the width of the first spacer or the width of the second spacer may be larger than the width of the first dummy spacer or the width of the second dummy spacer, so that the first doped region and the second doped region formed by using the first spacer and the second spacer as the mask are prevented from being too close to the gate. As a result, the gap between the first doped region formed by using the first spacer and the first dummy spacer as the mask and the gate and the gap between the second doped region formed by using the second spacer and the second dummy spacer as the mask and the gate may be increased, thereby reducing the GIDL effect and effectively decreasing the leakage current of the HV MOS transistor device in the off state.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage (HV) metal-oxide-semiconductor (MOS) transistor device, comprising:
   a semiconductor substrate;
   a gate structure disposed on the semiconductor substrate, wherein the gate structure comprises:
      a gate;
      a first spacer disposed at a first side of the gate, wherein the first spacer comprises a first indentation and two spacer portions, each of the spacer portions comprises a convex upper surface, and the convex upper surfaces face and contact each other to form the first indentation;
      a second spacer disposed at a second side of the gate opposite to the first side; and
      a gate dielectric layer disposed between the gate and the semiconductor substrate and between the first spacer and the semiconductor substrate;
   a first doped region disposed in the semiconductor substrate and adjacent to the first spacer, wherein the first spacer is disposed between the first doped region and the gate; and
   a second doped region disposed in the semiconductor substrate and adjacent to the second spacer, wherein the second spacer is disposed between the second doped region and the gate.

2. The HV MOS transistor device according to claim 1, wherein the spacer portions are symmetrical to each other, and the spacer portions are symmetrical with respect to a direction perpendicular to an upper surface of the semiconductor substrate.

3. The HV MOS transistor device according to claim 1, further comprising a first drift region disposed in the semiconductor substrate at the first side of the gate, wherein the first doped region is disposed in the first drift region, and the first drift region overlaps the gate in a direction perpendicular to an upper surface of the semiconductor substrate.

4. The HV MOS transistor device according to claim 3, further comprising a second drift region disposed in the semiconductor substrate at the second side of the gate, wherein the second doped region is disposed in the second drift region, and the second drift region overlaps the gate in the direction.

5. The HV MOS transistor device according to claim 1, further comprising a first dummy spacer disposed on the semiconductor substrate, wherein the first doped region is disposed between the first dummy spacer and the first spacer.

6. The HV MOS transistor device according to claim 1, further comprising a dummy gate structure disposed on the semiconductor substrate, wherein the first doped region is disposed between the dummy gate structure and the first spacer, and the dummy gate structure comprises:
 a dummy gate; and
 a first dummy spacer and a second dummy spacer respectively disposed at two sides of the dummy gate, and the first dummy spacer comprising a second indentation.

7. The HV MOS transistor device according to claim 6, wherein a structure of the first dummy spacer and a structure of the first spacer are the same.

8. The HV MOS transistor device according to claim 1, wherein the first spacer comprises a first oxide spacer.

9. The HV MOS transistor device according to claim 8, wherein the first spacer further comprises a nitride spacer disposed on the first oxide spacer.

10. The HV MOS transistor device according to claim 9, wherein the first spacer further comprises a second oxide spacer disposed on the nitride spacer.

11. The HV MOS transistor device according to claim 1, wherein a width of the first spacer is between 0.01 micrometer and 0.4 micrometer.

12. The HV MOS transistor device according to claim 1, further comprising two insulation structures disposed in the semiconductor substrate, wherein the first doped region and the second doped region are disposed between the insulation structures.

13. A manufacturing method of a HV MOS transistor device, comprising:
 providing a semiconductor substrate, a dielectric layer and a conductive layer, wherein the dielectric layer and the conductive layer are sequentially stacked on the semiconductor substrate;
 patterning the conductive layer to form a gate and a first dummy gate, wherein the first dummy gate is disposed at a first side of the gate;
 forming a first spacer on the dielectric layer between the gate and the first dummy gate, and forming a second spacer on the semiconductor substrate at a second side of the gate opposite to the first side, wherein the first spacer comprises a first indentation and two spacer portions, each of the spacer portions comprises a convex upper surface, and the convex upper surfaces face and contact each other to form the first indentation;
 removing the first dummy gate; and
 forming a first doped region and a second doped region in the semiconductor substrate at the first side and the second side of the gate respectively after removing the first dummy gate, wherein the first spacer is disposed between the first doped region and the gate, and the second spacer is disposed between the second doped region and the gate.

14. The manufacturing method of the HV MOS transistor device according to claim 13, wherein forming the first spacer comprises:
 depositing an oxide layer on the semiconductor substrate, the gate and the first dummy gate; and
 removing the oxide layer on the gate and the first dummy gate.

15. The manufacturing method of the HV MOS transistor device according to claim 13, wherein forming the first spacer comprises:
 sequentially depositing an oxide layer and a nitride layer on the semiconductor substrate, the gate and the first dummy gate; and
 removing the nitride layer and the oxide layer on the gate and the first dummy gate.

16. The manufacturing method of the HV MOS transistor device according to claim 13, wherein forming the first spacer comprises:
 sequentially depositing a first oxide layer, a nitride layer and a second oxide layer on the semiconductor substrate, the gate and the first dummy gate; and
 removing the second oxide layer, the nitride layer and the first oxide layer on the gate and the first dummy gate.

17. The manufacturing method of the HV MOS transistor device according to claim 13, wherein providing the semiconductor substrate further comprises providing a first drift region in the semiconductor substrate, and the first doped regions is formed in the first drift region.

18. The manufacturing method of the HV MOS transistor device according to claim 13, wherein providing the semiconductor substrate further comprises providing a second drift region in the semiconductor substrate, and the second doped region is formed in the second drift region.

19. The manufacturing method of the HV MOS transistor device according to claim 13, wherein forming the first spacer further comprises forming a first dummy spacer on a side of the first dummy gate, wherein the first dummy gate is disposed between the first dummy spacer and the first spacer.

20. The manufacturing method of the HV MOS transistor device according to claim 13, wherein patterning the conductive layer further comprises forming a second dummy spacer on the semiconductor substrate, and the first dummy gate is disposed between the second dummy gate and the gate, wherein forming the first spacer further comprises forming a first dummy spacer and a second dummy spacer on the semiconductor substrate, the first dummy spacer is disposed between the first dummy gate and the second dummy gate, the first dummy spacer comprises a second indentation, and the second dummy gate is disposed between the second dummy spacer and the first dummy spacer.

21. The manufacturing method of the HV MOS transistor device according to claim 20, wherein a structure of the first dummy spacer and a structure of the first spacer are the same.

22. The manufacturing method of the HV MOS transistor device according to claim 13, wherein providing the semiconductor substrate further comprising providing two insulation structures disposed in the semiconductor substrate, wherein the first doped region and the second doped region are disposed between the insulation structures.

23. The manufacturing method of the HV MOS transistor device according to claim 13, wherein a width of the first spacer is between 0.01 micrometer and 0.4 micrometer.

24. A HV MOS transistor device, comprising:
 a semiconductor substrate;
 a gate structure disposed on the semiconductor substrate, wherein the gate structure comprises:
  a gate;
  a first spacer disposed at a first side of the gate, wherein the first spacer comprises a first indentation and two spacer portions, the spacer portions symmetrical to each other with respect to a direction perpendicular to an upper surface of the semiconductor substrate; and a second spacer disposed at a second side of the gate opposite to the first side;

a first doped region disposed in the semiconductor substrate and adjacent to the first spacer, wherein the first spacer is disposed between the first doped region and the gate;

a second doped region disposed in the semiconductor substrate and adjacent to the second spacer, wherein the second spacer is disposed between the second doped region and the gate; and a first dummy spacer disposed on the semiconductor substrate, wherein the first doped region is disposed between the first dummy spacer and the first spacer.

* * * * *